United States Patent [19]

Barak

[11] Patent Number: 4,823,128

[45] Date of Patent: Apr. 18, 1989

[54] DIGITAL-TO-ANALOG CONVERTER FILTER FOR PRODUCING A CONTINUOUS ANALOG SIGNAL OUTPUT WITHOUT DISTORTION

[75] Inventor: David T. Barak, Aloha, Oreg.

[73] Assignee: Tektronix, Inc., Beaverton, Oreg.

[21] Appl. No.: 864,399

[22] Filed: May 19, 1986

[51] Int. Cl.⁴ ............................................. H03M 1/06
[52] U.S. Cl. .................................... 341/118; 341/126; 341/144
[58] Field of Search ................ 340/347 DA, 347 GC, 340/347 M; 324/121 R, 77 R; 341/118, 126, 144

[56] References Cited

U.S. PATENT DOCUMENTS

| | | | |
|---|---|---|---|
| 3,846,647 | 11/1974 | Tanimoto | 328/20 X |
| 3,877,023 | 4/1975 | Spicer et al. | 340/347 DA |
| 4,132,908 | 1/1979 | Hughes | 340/347 SH X |
| 4,198,608 | 4/1980 | Comley | 340/347 DA X |
| 4,430,641 | 2/1984 | Baur et al. | 340/347 DA |
| 4,443,787 | 4/1984 | Denk et al. | 340/347 P |
| 4,573,033 | 2/1986 | Kolodin | 340/347 DA |
| 4,584,559 | 4/1986 | Penney | 307/352 X |
| 4,599,525 | 7/1986 | Tzeng | 307/574 X |

OTHER PUBLICATIONS

The Engineering Staff of Analog Devices, Inc., Analog-Digital Conversion Handbook, 6/1972, pp. I-94 to I-97.

Grob, Basic Television, McGraw-Hill Book Co., Inc., 1954, pp. 64–69.

Primary Examiner—William M. Shoop, Jr.
Assistant Examiner—Richard K. Blum
Attorney, Agent, or Firm—Peter J. Meza; Mark L. Becker

[57] ABSTRACT

A digital-to-analog converter filter circuit includes a means for generating a blanking signal to coincide with a change in the digital signal value to the converter and an analog switch controlled by the blanking signal. The analog switch receives the analog signal from the converter and passes the signal depending on the state of the blanking signal. The blanking signal controls the switch to block passage of the analog signal for a predetermined time sufficient for the analog signal to settle after transition from a first value to a second value in response to the change in the digital input signal value. The analog switch is connected to a vector filter which receives the analog signal and transmits a delayed transition signal from the first analog signal value signal to the second value. The filter transmits the first value until the switch passes the second value upon command of the blanking signal. The delayed transistion signal represents a distortion-free reproduction of a waveform that can be routed to a display such as a cathode ray tube.

1 Claim, 3 Drawing Sheets

DIGITAL-TO-ANALOG CONVERTER FILTER FOR PRODUCING A CONTINUOUS ANALOG SIGNAL OUTPUT WITHOUT DISTORTION

FIELD OF THE INVENTION

This invention relates to digital-to-analog converters and, more particularly, to a circuit for filtering out distortion in the transition of the analog output signal from a first value to a second value.

BACKGROUND OF THE INVENTION

Digital-to-analog converters, as the name implies, convert a digital input signal to a corresponding analog output signal. In transition of the analog output signal from an old value to a new value in response to a change in the digital input signal, digital-to-analog converters generate a spike or distortion in the output signal before the signal settles to its new value. This distortion is of major concern in circumstances where the analog signal is to be displayed or otherwise sensed. For example, in a digital oscilloscope, a waveform may be stored digitally in memory and then displayed in the analog form at some later time. The digital signal values representing the waveforms are converted to discrete analog dots on a display. To produce the appearance of a continuous waveform, a vector filter generates a transition signal that is displayed to connect one dot to the next. However, the output distortion is also displayed, giving a misleading appearance to the reproduced waveform.

Attempts in the past to remove this distortion from the reproduced waveform have focused on utilizing improved digital-to-analog converter technology to minimize the signal spike. Although new technology has lead to some improvement, it has not totally removed the distortion, especially in light of the higher frequency signals applied to the digital-to-analog converters in advanced instrumentation. Moreover, the high performance circuitry that is required has a much higher cost than standard circuit devices.

SUMMARY OF THE INVENTION

An object, therefore, of the invention is to filter out distortion in the transition of an analog output signal of a digital-to-analog converter.

Another object of the invention is to provide such filtering at a low cost, utilizing inexpensive, current circuit technology.

Yet another object of the invention is to produce a distortion-free analog reproduction of a digitally stored waveform.

To achieve these objects, a digital-to-analog converter filter circuit includes means for generating a blanking signal to coincide with the change in the digital input signal value to the converter. The analog signal generated by the converter is received by a switch means which passes the analog output signal further to a display. The blanking signal controls the switch means to block passage of the output signal until the output signal settles after transition from a first value to a second value in response to the change in the digital input signal value.

Filter means may be coupled to the switch means for receiving the analog signal and transmitting a delayed transition signal from the first value of the analog signal to the second value. The filter means transmits the first analog signal value until the switch means passes the second value upon command of the blanking signal, then transmits the transition signal to the second value to reproduce a waveform.

In a preferred embodiment, the signal means includes a blanking signal generator activated by the generation of digital input signals to the converter. The blanking signal is transmitted to a delay generator that controls the duration of the blanking signal actually applied to the switch means. From the delay generator, a buffer means transmits the blanking signal to the switch means.

The foregoing and other objects, features, and advantages of the invention will become more apparent from the following detailed description of a preferred embodiment which proceeds with reference to the accompanying drawings.

DETAILED DESCRIPTION

Figure 1:
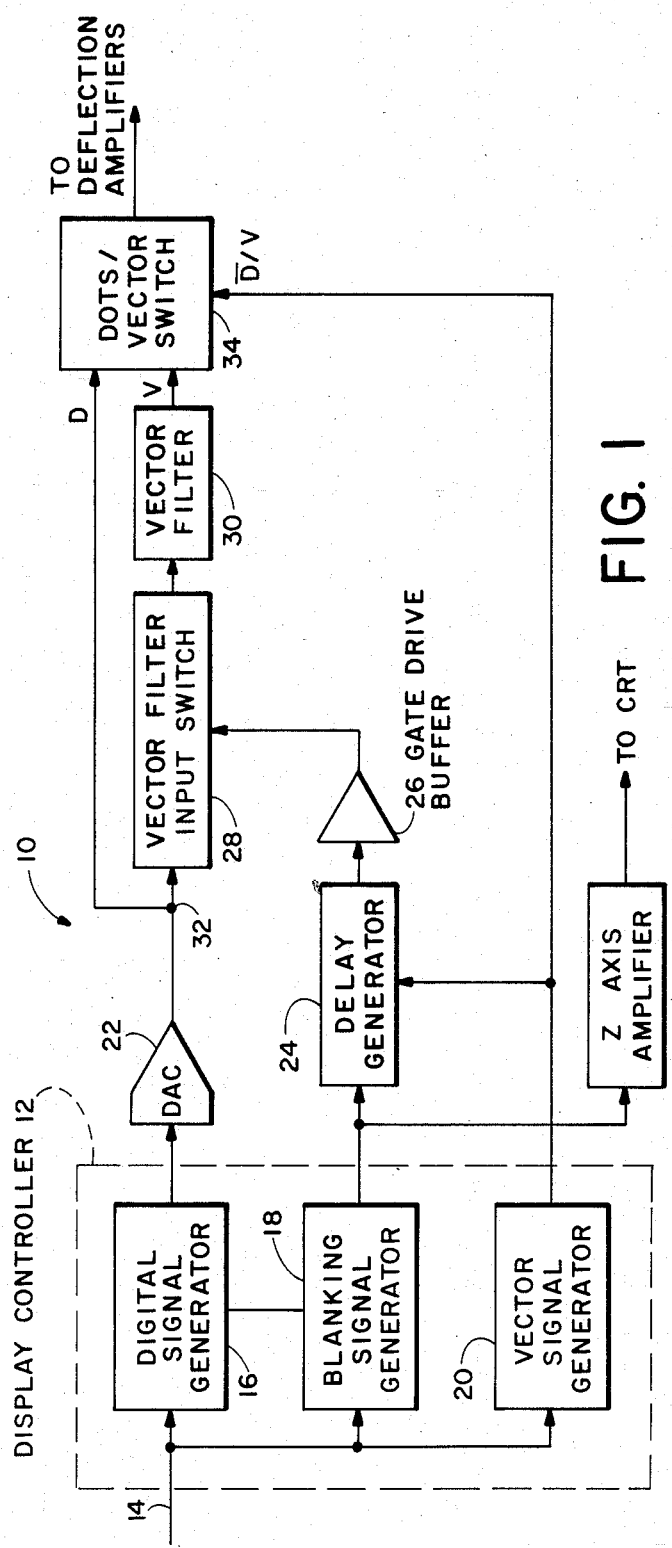
FIG. 1 is a block diagram of a filter circuit according to the invention.

FIG. 1 shows a block diagram of a circuit 10 according to the invention. A display controller 12 receives on input line 14 digital information that includes signals representative of alphanumeric characters or of a waveform stored in memory to be displayed via an electron beam on a display such as a cathode ray tube. The controller 12 also receives a vector signal for determining whether the alphanumeric character or waveform will be displayed. Included in the display controller 12 are a digital signal generator 16, a blanking signal generator 18, and a vector signal generator 20. The digital signal generator 16 transmits digital signals representative of a location of the electron beam, such as a vertical or horizontal coordinate, to a digital-to-analog converter (DAC) 22 for conversion to analog output signals. The DAC 22 is of conventional design, such as a DAC 10 manufactured by Precision Monolithics Incorporated. The digital signal generator 16 also signals the blanking signal generator 18 to generate a blanking signal for a predetermined time in the form of a pulse to coincide with generation of the signals. From the generator 18 the blanking signal is routed through a delay generator 24 that controls the duration of the blanking signal pulse to a gate drive buffer 26 that buffers the signal for transmission as a control signal to an analog input switch 28. The switch 28 can be one of a number of high speed analog switches commercially available, such as the SD 5000 manufactured by Siliconix Incorporated. The blanking signal is also routed to a Z-axis amplifier 29 to blank the electron beam for a predetermined time after each set of digital input signals is generated by the generator 16.

The switch 28 also receives the analog input signal from the DAC 22 for passage to a vector filter 30. With the blanking signal pulse absent (logic 0), the signal enables the switch 28 and allows passage of the analog signal to the filter 30. With the blanking signal pulse present (logic 1), the signal disables the analog switch 28 and blocks passage of the analog signal from the DAC 22 to the filter 30. In application, the blanking signal pulse is generated simultaneously with the generation of the digital signals to block passage of the resultant analog signal until that signal settles after transition from a first to a second value. When the filter 30 receives the analog signal, it generates a delayed-transition signal from the first analog signal value to the second value to link the discrete analog values. Until the switch 28 passes the second analog signal value, the filter 30 will continue to transmit the first value. The signal transmitted by the filter 30 is thus a continuous analog signal characteristic of a waveform.

The discrete values that form the analog output signal from the DAC 22 are also routed around the switch 28 at a preceding node 32 and along a path 33 to a dots/-vector analog switch 34 of conventional design, such as a 74HC4053. The switch 34 also receives the delayed-transition signal of the filter 30. The discrete signal values from the DAC 22 represent dots forming alphanumeric characters. The delayed transition signal from the filter 30 represents a waveform. One of the two signals is passed through the switch 34 to a reception point such as the deflection amplifiers of a cathode ray tube. The choice of which signal is passed is determined by the state of the vector signal from the vector signal generator 20. In a logic 0 state, the vector signal directs the switch 34 to transmit the discrete analog signal values to the deflection amplifiers. In a logic 1 state, the vector signal directs the switch 34 to transmit the delayed transition signal to the deflection amplifier. The vector signal also enables and disables the delay generator 24 to disable the switch 30 independent of the state of the blanking signal. This disabling of the switch 30 avoids current loading of the DAC 22 by the filter 30 when the discrete analog output signals are transmitted through the switch 34.

In the operation of circuit 10, information is first received over line 14 by the display controller 12. If the information represents a digitally stored waveform, the vector signal generator 20 generates a logic 1 state for the vector signal which enables the delay generator and directs the switch 34 to pass the transition output signal of the filter 30 to the deflection amplifiers. The digital signals representative of the waveform are converted to an analog output signal by the DAC 22 and transmitted therefrom to the vector filter input switch 28. The blanking signal pulse is generated coincidentally with the transmission of the digital signals to the DAC 22 and routed through the delay generator 24 and gate drive buffer 26 to the vector filter input switch 28. The blanking pulse disables the switch 28 for a predetermined time sufficient to block passage of the analog output signal to the filter 30 until the distortion in the transition disappears and the signal settles to its new value.

Figure 2:
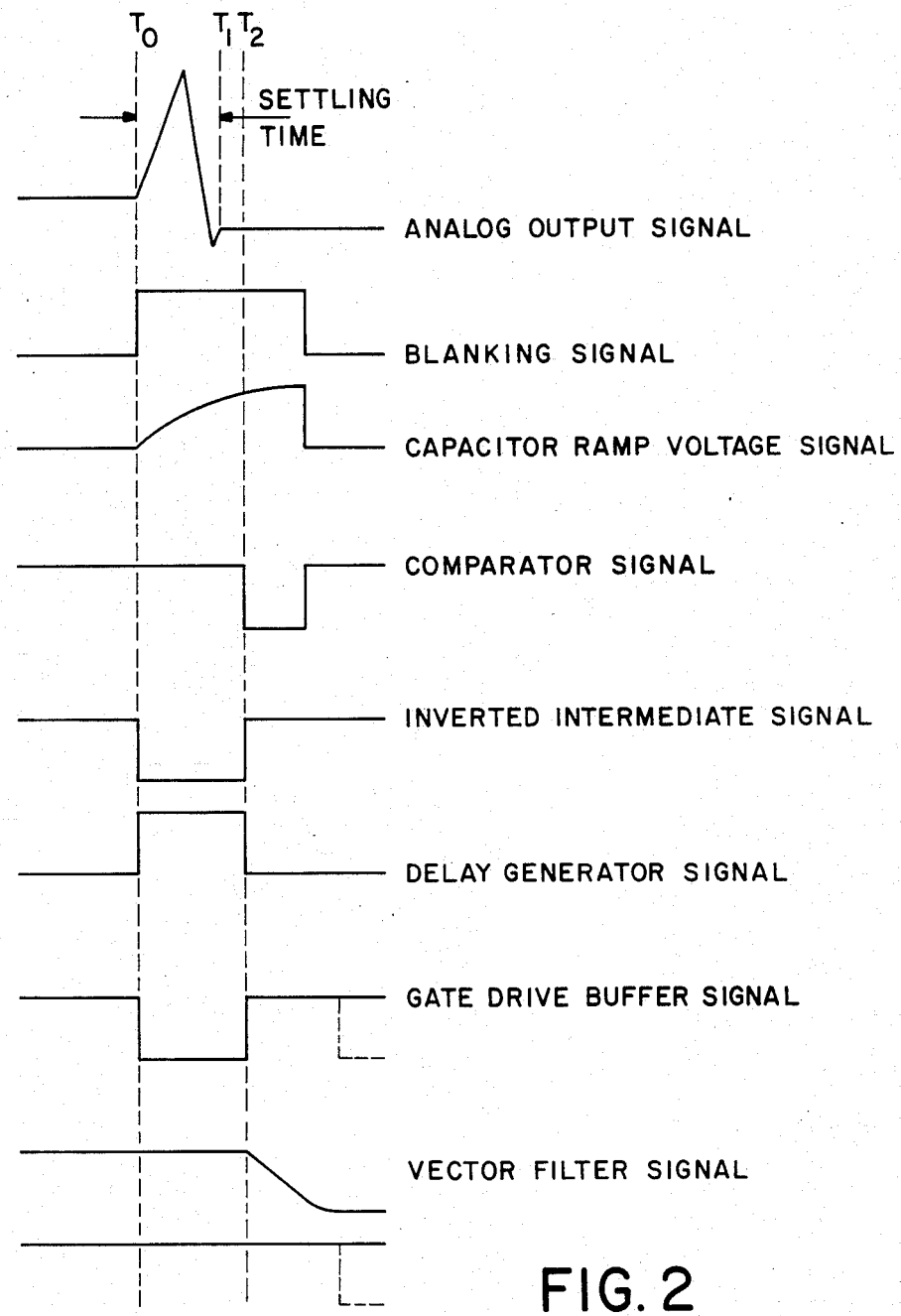
FIG. 2 is a comparison of waveforms generated by the filter circuit of FIG. 1.

FIG. 2 shows a timing diagram of the waveforms generated within circuit 10. The analog output signal generates a spike at $t_o$ as it changes from a first value to a second value at $t_1$. The blanking signal pulse is generated simultaneously at $t_o$ but endures for a time greater than the settling time $t_1 - t_o$ of the analog output signal. As seen in FIG. 2, the duration of the blanking signal pulse actually applied to the switch 28 is less than the life of the pulse, controlled by the adjustable delay generator 24, from which the blanking signal emerges as a delay generator signal of time $t_2 - t_o$. The delay generator signal is routed to the gate drive buffer 26 where the signal is inverted as a gate drive buffer signal that actually controls the switch 28.

The vector filter 30 maintains the first value of the analog output signal present at $t_o$ until the delay generator signal pulse ends and the switch 28 is enabled to pass the second value at $t_2$. At $t_2$, the filter 30 generates the delayed transition signal that provides a transition to the second value. With the vector signal at a logic 1 state during this time, this transition signal is routed through the switch 34 to the deflection amplifiers.

If the analog output signals from the DAC 22 represent dots of alphanumeric characters rather than a waveform, the vector signal will be in its logic 0 state to disable the buffer 26 and thus the switch 28. The discrete values of the analog signal are passed from the DAC 22 along path 33 through the switch 34 to the deflection amplifiers.

Figure 3:
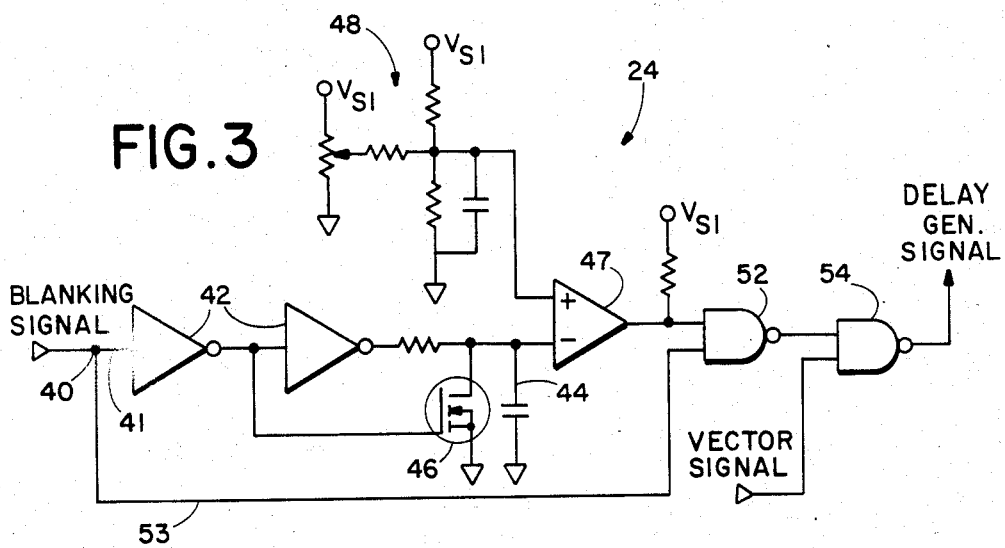
FIG. 3 is a schematic diagram showing a detailed embodiment of a portion of the filter circuit of FIG. 1.

FIG. 3 shows a detailed embodiments of the adjustable delay generator 24. The blanking signal entering the generator 24 branches at a node 40, with the signal passing in a branch 41 through a series of inverters 42 for inverting the signal before applying it to charge a capacitor 44. A transistor 46 discharges the capacitor 44 once the blanking pulse ends. The capacitor 44 provides a ramp voltage signal, shown in FIG. 2, to a comparator 47 for comparison against a reference voltage from an adjustable reference source 48. The comparator output signal is initially logic high (see FIG. 2) until the capacitor voltage rises above the level of the reference voltage source 48, at which point the comparator signal goes logic low at $t_2$. The voltage at which the source 48 is set thus determines the actual duration of the blanking signal applied to the switch 28. The comparator 47 transmits the comparator signal to a NAND gate 52 whose other input signal is the blanking signal from the other branch 53 originating at node 40. Initially the output signal of the NAND gate 52 (labeled inverted intermediate signal in FIG. 2) goes low (logic 0) when the blanking signal is generated at $t_o$, but eventually the inverted intermediate signal goes high (logic 1) on the change in the comparator output signal. NAND gate 52 is connected to second NAND gate 54 that again inverts the signal to produce the delay generator signal. The other input signal to the NAND gate 54 is the vector signal, which enables the delay generator 24 when a waveform is to be reproduced by the filter 30.

Figure 4:
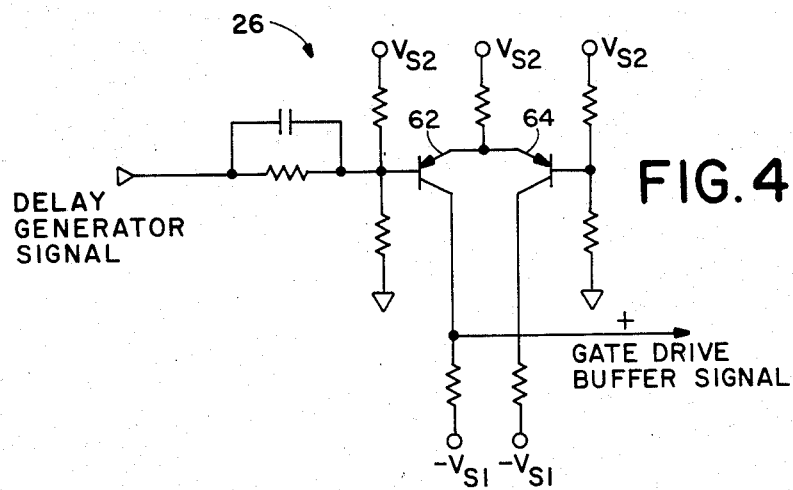
FIG. 4 is a schematic diagram showing a detailed embodiment of another portion of the filter circuit.

Referring to FIG. 4, the gate drive buffer circuit 26 is shown in detail. It comprises a differential pair of transistors 62 and 64, with the transistor 62 receiving at its base the delay generator signal from NAND gate 54. When the delay generator signal is high (logic 1), which indicates the presence of the blanking signal pulse, the transistor 62 does not conduct and current in the differential pair is routed through transistor 64. When the delay generator signal goes low (logic 0) transistor 62 conducts and the blanking signal is routed as the gate drive buffer signal to the switch 28.

Figure 5:
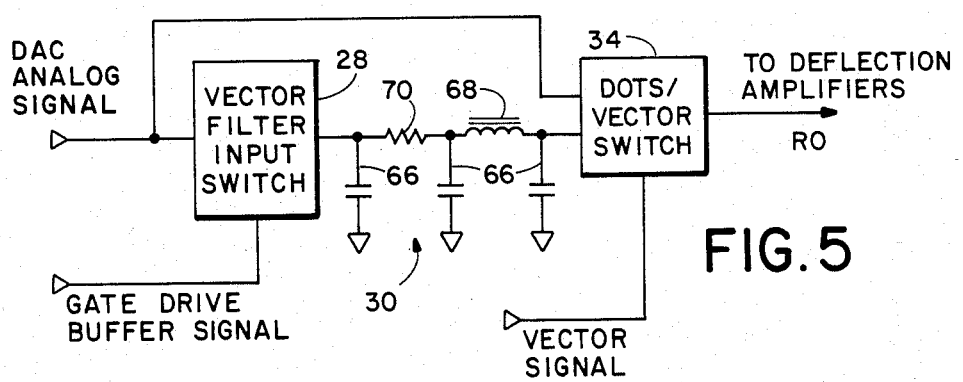
FIG. 5 is a schematic diagram showing a detailed embodiment of a third portion of the filter circuit.

FIG. 5 shows the vector filter 30 in detail. It comprises a number of capacitors 66, inductors 68, and a resistor 70 conventionally chosen so as to maintain a first signal value until a second value is received and then provide a transition signal of a predetermined delay time to the second value. The values of the circuit elements may be determined by a circuit simulation program such as SPICE.

The circuit 10 illustrates a circuit for generating either the vertical or horizontal set of coordinates for an electron beam striking the screen of a cathode ray tube. For generating the other set of coordinates, the same circuit may be used.

Having illustrated and described the principles of the invention in a preferred embodiment, it should be apparent to those skilled in the art that the invention can be modified in arrangement and detail without departing from such principles. For example, the circuit 10 could employ differential signals instead of a single signal to minimize noise in the circuit. I claim all modifications coming within the spirit and scope of the following claims.

I claim:

1. In an oscilloscope for displaying symbol and waveform information, a circuit for selectably producing from the output of a digital-to-analog converter discrete analog signals to display a symbol or a continuous analog signal from a first value to a second value to display a waveform, comprising:

means for generating a digital input signal to produce an analog output signal, a blanking signal to coincide with a change in the digital input signal value, and a vector signal to determine the display of the symbol or waveform;

a first analog switch for receiving and passing the analog output signal of the digital-to-analog converter, the switch controlled by the blanking signal to block passage of the analog output signal until the analog signal settles after transition to the second value;

a vector filter for transmitting a delayed-transition signal from the first value of the analog output signal to the second value, the filter receiving the second value of the output signal upon command of the blanking signal; and a second analog switch controlled by the vector signal for receiving both the delayed-transition signal of the vector signal and the analog output signal of the digital-to-analog converter and transmitting one of the signals upon command of the vector signal, the analog output signal from the digital-to-analog converter displaying dots defining the symbol and the delayed-transition signal displaying a continuous line defining the waveform.

* * * * *